United States Patent [19]
Glover

[11] Patent Number: 6,098,192
[45] Date of Patent: Aug. 1, 2000

[54] COST REDUCED FINITE FIELD PROCESSOR FOR ERROR CORRECTION IN COMPUTER STORAGE DEVICES

[75] Inventor: Neal Glover, Broomfield, Colo.

[73] Assignee: Cirrus Logic, Inc., Fremont, Calif.

[21] Appl. No.: 08/932,121

[22] Filed: Sep. 17, 1997

[51] Int. Cl.[7] .................................................. G11C 29/00
[52] U.S. Cl. ........................................................... 714/770
[58] Field of Search .................................... 714/770, 758, 714/784, 752; 708/492, 512, 517

[56] References Cited

U.S. PATENT DOCUMENTS

| | | | |
|---|---|---|---|
| 4,410,989 | 10/1983 | Berlekamp . | |
| 4,494,234 | 1/1985 | Patel | 714/757 |
| 4,567,568 | 1/1986 | Inagawa et al. | 708/650 |
| 4,989,171 | 1/1991 | Hollmann | 708/492 |
| 4,994,995 | 2/1991 | Anderson et al. | 708/492 |
| 5,420,873 | 5/1995 | Yamagishi et al. | 371/38.1 |
| 5,467,297 | 11/1995 | Zook | 708/492 |
| 5,590,138 | 12/1996 | Iwamura | 371/37.1 |
| 5,757,826 | 5/1998 | Fredrickson | 714/752 |
| 5,771,246 | 6/1998 | Weng | 714/782 |
| 5,778,009 | 7/1998 | Fredrickson et al. | 714/756 |
| 5,787,099 | 7/1998 | Lan et al. | 714/784 |
| 5,831,878 | 11/1998 | Ishida | 708/277 |

FOREIGN PATENT DOCUMENTS 205434  4/1992  Japan ............................ H03M 13/00

OTHER PUBLICATIONS

Whiting, Douglas L., *Bit–Serial Reed–Solomon Decoders in VLSI*, California Institute of Technology, Aug. 1984, pp. 36–58.

Glover, N. and Dudley, T., *Practical Error Correction Design for Engineers*, Revised Second Edition, Cirrus Logic—Colorado, 1991, pp. 87–134.

*Primary Examiner*—Hoa T. Nguyen
*Assistant Examiner*—Shelly A Chase
*Attorney, Agent, or Firm*—Howard H. Sheerin; Dan Shifrin

[57] ABSTRACT

A cost reduced finite field processor is disclosed for computing the logarithm $LOG_\alpha(\alpha^j)$ of an element of a finite field $GF(2^n)$ using significantly less circuitry than that required by a lookup table typically employed in the prior art. The result of the logarithm (i.e., the exponent of $\alpha^j$) is represented as a binary number computed serially one bit per clock cycle. In one embodiment, combinatorial logic is used to compute bit 0 of the exponent. On each clock cycle, the exponent is shifted once to the right and bit of the exponent is extracted until the entire exponent has been computed. Shifting the exponent of a field element to the right is carried out by taking the square root of the element. The present invention requires at most n+1 clock cycles to compute $LOG_\alpha(\alpha^j)$, with one embodiment requiring n/2 clock cycles. The circuitry for computing the square root of a field element and for computing bit 0 of the logarithm of a field element is significantly less than that required to implement the logarithm operation using a lookup table.

40 Claims, 10 Drawing Sheets

COST REDUCED FINITE FIELD PROCESSOR FOR ERROR CORRECTION IN COMPUTER STORAGE DEVICES

CROSS REFERENCE TO RELATED APPLICATIONS AND PATENTS

This application is related to several U.S. patents, namely U.S. Pat. No. 5,446,743 entitled "COEFFICIENT UPDATING METHOD AND APPARATUS FOR REED-SOLOMON DECODER," U.S. Pat. No. 5,467,297 entitled "FINITE FIELD INVERSION," and U.S. Pat. No. 5,280,488 entitled "REED-SOLOMON CODE SYSTEM EMPLOYING K-BIT SERIAL TECHNIQUES FOR ENCODING AND BURST ERROR TRAPPING." All of the above-named patents are assigned to the same entity, and all are incorporated herein by reference.

FIELD OF INVENTION

The present invention relates to error correcting systems for computer storage devices, particularly to a cost reduced finite field processor for generating the logarithm (and optionally the inverse) of an element in a finite field.

BACKGROUND OF THE INVENTION

Computer storage devices (such as magnetic and optical disk drives) typically employ error correction codes to correct errors in the recorded data due to noise corrupting the carrier signal during the recording/reproduction process. In error correction coding, the binary data to be recorded are processed mathematically to generate redundancy symbols that are appended to the data to form codewords which are written to the disk storage medium. Upon readback, the recorded codewords are estimated (detected) from the read signal, and the redundancy symbols are used to decode the estimated codewords back into the originally recorded user data. The redundancy symbols provide, in effect, a buffer which shields the codeword from noise as it passes through the recording channel. When enough noise "penetrates" this buffer, it mutates a written codeword into a different received codeword, thereby resulting in an error when decoded into the user data.

The more redundancy symbols employed in an error correction code, the larger the buffer around the codeword and the more noise that can be tolerated before a decoding error occurs. However, there is an upper bound on the performance of any given recording channel known as the "channel capacity" which refers to the maximum user data transmission rate (or recording density) achievable for a given channel while maintaining an arbitrarily low bit error rate. Ultimately, the channel capacity is a function of the channel bandwidth and the signal to noise (SNR) ratio. For bandlimitted channels, such as in the typical computer storage system, error correction codes are a means for improving performance by increasing the effective SNR.

There are many approaches to encoding/decoding the user data in order to maximize the reliability and efficiency of a recording channel; ultimately the goal is to design a system that approaches the channel capacity while minimizing the implementation complexity and cost. Examples of error correction codes typically employed in computer storage devices range from simple Hamming codes to more complex, but more powerful and efficient codes, such as the Reed-Solomon block code or convolutional codes. Most of the popular error correction codes, such as the Reed-Solomon code, exploit mathematical properties over finite fields to implement the error correction capabilities.

Finite fields, or Galois fields (GF), are fields comprising a finite number of elements. The order of a finite field is the number of elements it contains. A finite field of order $p^n$, denoted $GF(p^n)$, exists for every prime p and every positive integer n. The prime p of a finite field $GF(p^n)$ is called the characteristic of the field. The field $GF(p)$ is referred to as the ground field and $GF(p^n)$ is called an extension field of $GF(p)$. The field $GF(p^n)$ can also be denoted $GF(q)$ where $q=p^n$.

Most error correction codes of a practical interest are defined over fields of characteristic 2 (i.e., $GF(2^n)$). The finite field $GF(2)$ has only two elements (0,1). Larger fields can be defined by polynomials with coefficients from $GF(2)$. If a polynomial $p(x)$ of degree n with coefficients from $GF(2)$ is primitive and $\alpha$ is a root of $p(x)$, then the powers of $\alpha$ up through $2^n-2$ will all be unique. Appropriately selected operations of addition and multiplication together with the field elements $$0, 1, \alpha^1, \alpha^2, \alpha^3, \ldots, \alpha^{2^n-2}$$

define a field of $2^n$ elements $GF(2^n)$.

Consider, for example, that a finite field is defined by the polynomial $$p(x)=x^3+x+1.$$

Since $\alpha$ is a root of $p(x)$, $p(\alpha)=0$. Therefore, $$\alpha^3+\alpha+1=0 \text{ and } \alpha^3=\alpha+1.$$

The field elements for this field are generated by successively computing $$\alpha^{j+1}=\alpha^j\cdot\alpha.$$

The elements are $0=0$ $\alpha^0=1$ $\alpha^1=\alpha^1$ $\alpha^2=\alpha^2$ $\alpha^3=\alpha+1$ $\alpha^4=\alpha\cdot\alpha^3=\alpha\cdot(\alpha+1)=\alpha^2+\alpha^1$ $\alpha^5=\alpha\cdot\alpha^4=\alpha\cdot(\alpha^2+\alpha)=\alpha^3+\alpha^2=\alpha^2+\alpha^1+1$ $\alpha^6=\alpha\cdot\alpha^5=\alpha\cdot(\alpha^2+\alpha+1)=\alpha^3+\alpha^2+\alpha=\alpha^2+1$ The elements of this field can be represented in binary fashion by using one bit to represent each of the three powers of $\alpha$ whose sum comprises an element as shown in Table 1:

TABLE 1

|        | $\alpha^2$ | $\alpha^1$ | $\alpha^0$ |
|--------|------------|------------|------------|
| 0      | 0          | 0          | 0          |
| $\alpha^0$ | 0      | 0          | 1          |
| $\alpha^1$ | 0      | 1          | 0          |
| $\alpha^2$ | 1      | 0          | 0          |
| $\alpha^3$ | 0      | 1          | 1          |
| $\alpha^4$ | 1      | 1          | 0          |
| $\alpha^5$ | 1      | 1          | 1          |
| $\alpha^6$ | 1      | 0          | 1          |

It is well known that decoding an error correction code entails processing the estimated codeword data mathematically using certain finite field arithmetic operations. With Reed-Solomon codes, for example, each symbol of the data stream is typically selected from a finite field $GF(2^n)$ where n is the number of binary data bits in a symbol. Each symbol of the k-symbol input block represents the coefficients of a data polynomial $D(x)$. The redundancy symbols (which are also represented as a polynomial $W(x)$) are then computed as the modulo division of the input data polynomial $D(x)$ by a generator polynomial $G(x)$:

$$W(x) = (x^m \cdot D(x)) \bmod G(x)$$

where m is the degree of the generator polynomial which equals the number of redundancy symbols. The redundancy polynomial $W(x)$ is then added to the data polynomial $D(x)$ to generate a codeword polynomial $C(x)$:

$$C(x) = (x^m \cdot D(x)) + W(x)$$

The encoder circuitry for performing the above operations can be implemented simply as a linear feedback shift register (LFSR).

After encoding, the codeword $C(x)$ is transmitted through the noisy communication channel, wherein the received codeword $C'(x)$ equals the transmitted codeword $C(x)$ plus an error polynomial $E(x)$. The received codeword $C'(x)$ is corrected according to the following steps: (1) compute error syndromes $S_i$; (2) compute the coefficients of an error locator polynomial using the error syndromes $S_i$; (3) compute the roots of the error locator polynomial, the logs of the roots are the error locations $L_i$; (4) compute the error values using the error syndromes $S_i$ and the roots of the error locator polynomial.

The error syndromes $S_i$ are computed as the modulo division of the received codeword polynomial $C'(x)$ by the factors of the generator polynomial $G(x)$:

$$S_i = C'(x) \bmod (x + \alpha^i)$$

when $$G(x) = \prod_{i=0}^{m-1} (x + \alpha^i)$$

where $\alpha$ is a primitive element of the finite field $GF(2^n)$. Techniques for performing the other steps of the decoding process, computing the error locator polynomial, computing the roots of the error locator polynomial, and computing the error values, are well known by those skilled in the art (see the above referenced U.S. patent REED-SOLOMON CODE SYSTEM EMPLOYING K-BIT SERIAL TECHNIQUES FOR ENCODING AND BURST ERROR TRAPPING).

There are different methods in the prior art for generating the error locator polynomial from which the error locations and values can be determined. Typically, these methods require the finite field division operation and may also require the finite field logarithm operation depending on the implementation. In the single error case, for example, the error locator polynomial is $$x + \sigma$$

where $\sigma = S_1/S_0$ ($S_0$ and $S_1$ are the error syndromes described above). Thus, the coefficient $\sigma$ is computed by dividing the $S_1$ syndrome by the $S_0$ syndrome. The logarithm of $\sigma$, $LOG(\sigma)$, is the location of the error within the received codeword polynomial $C'(x)$ and the error value is simply the error syndrome $S_0$.

The logarithm of an element is defined as $$LOG_\alpha(x) = LOG_\alpha(\alpha^j) = j.$$

For example, the logarithm of the fifth element in Table 1 above corresponding to $\alpha^3 = 011$ is $$LOG_\alpha(011) = LOG_\alpha(\alpha^3) = 3.$$

The logarithm operation is typically implemented as a lookup table on the order of the field size. That is, the field element x in $LOG_\alpha(x)$ is used to address a lookup table of size $2^n$ with n bits per entry (i.e., n bits per element). This technique, however, is not cost effective when the size of the field increases in order to increase the power of the error correction code. For example, to compute the logarithm of a finite field $GF(2^8)$ requires a lookup table (e.g., a ROM) on the order of 256 by 8 bits.

The division operation is another finite field operation typically requiring a lookup table. Division in a finite field is carried out by taking the inverse of the denominator element and then multiplying. For example $$\alpha^i/\alpha^j = \alpha^i \cdot (1/\alpha^j).$$

The inverse operation $(1/\alpha^j)$ is computed as $$\frac{1}{\alpha^j} = \alpha^{(2^n - 1 - j)}.$$

Similar to computing the logarithm of an element, computing the inverse of an element is typically implemented using a lookup table on the order of the field size, which is inefficient as the field size grows. The above U.S. patent entitled "FINITE FIELD INVERSION" discloses a cost reduced method for computing the inverse of a field element without a lookup table, but the circuitry disclosed in that patent only implements the inversion operation and does not share circuitry for computing a logarithm of a field element.

There is, therefore, a need for a finite field processor that can compute the logarithm of a finite field element in a more cost effective manner. Another object of the present invention is to share circuitry for computing both the logarithm and inversion of a finite field element, thereby obviating the cost of lookup tables typically employed in the prior art.

SUMMARY OF THE INVENTION

A cost reduced finite field processor is disclosed for computing the logarithm $LOG_\alpha(\alpha^j)$ of an element of a finite field $GF(2^n)$ using significantly less circuitry than that required by a lookup table typically employed in the prior art. The result of the logarithm (i.e., the exponent of $\alpha^j$) is represented as a binary number computed serially one bit per clock cycle. In one embodiment, combinatorial logic is used to compute bit 0 of the exponent. On each clock cycle, the exponent is shifted once to the right and bit 0 of the exponent is extracted until the entire exponent has been computed. Shifting the exponent of a field element to the right is carried out by taking the square root of the element. The present invention requires at most n+1 clock cycles to compute $LOG_\alpha(\alpha^j)$, with one embodiment requiring n/2 clock cycles. The circuitry for computing the square root of a field element and for computing bit 0 of the logarithm of a field element is significantly less than that required to implement the logarithm operation using a lookup table.

In an alternative embodiment, the finite field processor is modified to compute both the logarithm and inverse of a field element concurrently using the same circuitry. In yet a further cost reduced embodiment, bit 0 of the logarithm of only a subset of field elements is computed, and the logarithms for the remaining elements are computed as rotations of the subset logarithms. This embodiment requires less circuitry to compute bit 0 of the logarithm, but it also requires more clock cycles to generate the final result.

BRIEF DESCRIPTION OF THE DRAWINGS

The above and other aspects and advantages of the present invention will be better understood by reading the following detailed description of the invention in view of the drawings, wherein.

DETAILED DESCRIPTION OF THE PREFERRED EMBODIMENT

Overview

Figure 1:
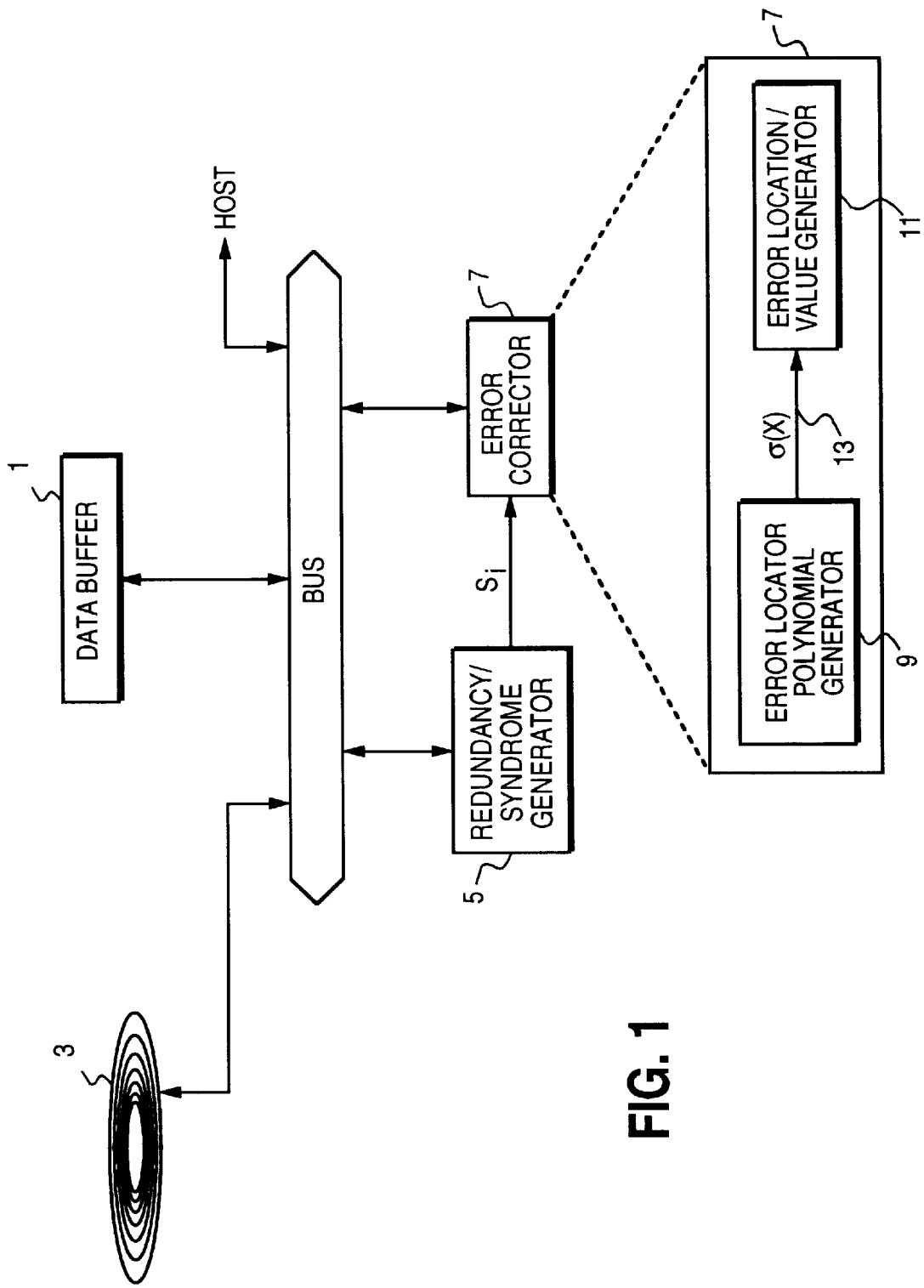
FIG. 1 shows an overview of an error correction system wherein the finite field processor of the present invention may be employed.

FIG. 1 shows an overview of an error correction system for disk storage systems which may incorporate the finite field processor of the present invention. During a write operation, user data is received from a host system and stored in a data buffer 1 with the capacity to store several data sectors. The user data is then read from the data buffer 1 and written to a disk storage medium 3 (e.g., optical or magnetic). As the user data is written to the disk 3, a redundancy/syndrome generator 5 generates redundancy symbols, represented as a polynomial W(x), according to the following operation:

$$W(x)=(x^m \cdot D(x))MOD\ G(x)$$

where the user data symbols are represented as coefficients of a data polynomial D(x), G(x) is a generator polynomial, and m is the degree of the generator polynomial which equals the number of redundancy symbols. The redundancy polynomial W(x) is then added to the data polynomial D(x) to generate a codeword polynomial C(x):

$$C(x)=(x^m \cdot D(x))+W(x).$$

The encoder circuitry for performing the above operations can be implemented simply as a linear feedback shift register (LFSR).

During a read operation, data is read from the disk 3 and stored in the data buffer 1. The data read is represented as a received codeword polynomial C'(x) which equals the written codeword polynomial C(x) plus an error polynomial E(x). As the data is read from the disk 3 and stored in the data buffer, the redundancy/syndrome generator 5 generates error syndromes $S_i$ as the modulo division of the received codeword polynomial C'(x) by the factors of the generator polynomial G(x):

$$S_i = C'(x)MOD(x+\alpha^i)$$

when $$G(x) = \prod_{i=0}^{m-1}(x+\alpha^i)$$

where $\alpha$ is a primitive element of the finite field $GF(2^n)$. If the error syndromes $S_i$ are non-zero, indicating that the received codeword contains errors, then an error corrector 7 processes the error syndromes to: (1) compute the coefficients of an error locator polynomial σ(x) using the error syndromes $S_i$; (2) compute the roots of the error locator polynomial, the logs of the roots are the error locations $L_i$; (3) compute the error values using the error syndromes $S_i$ and the error locations $L_i$. Thus, as shown in FIG. 1, the error corrector 7 comprises an error locator polynomial generator 9 and an error location/value generator 11.

Figure 2:
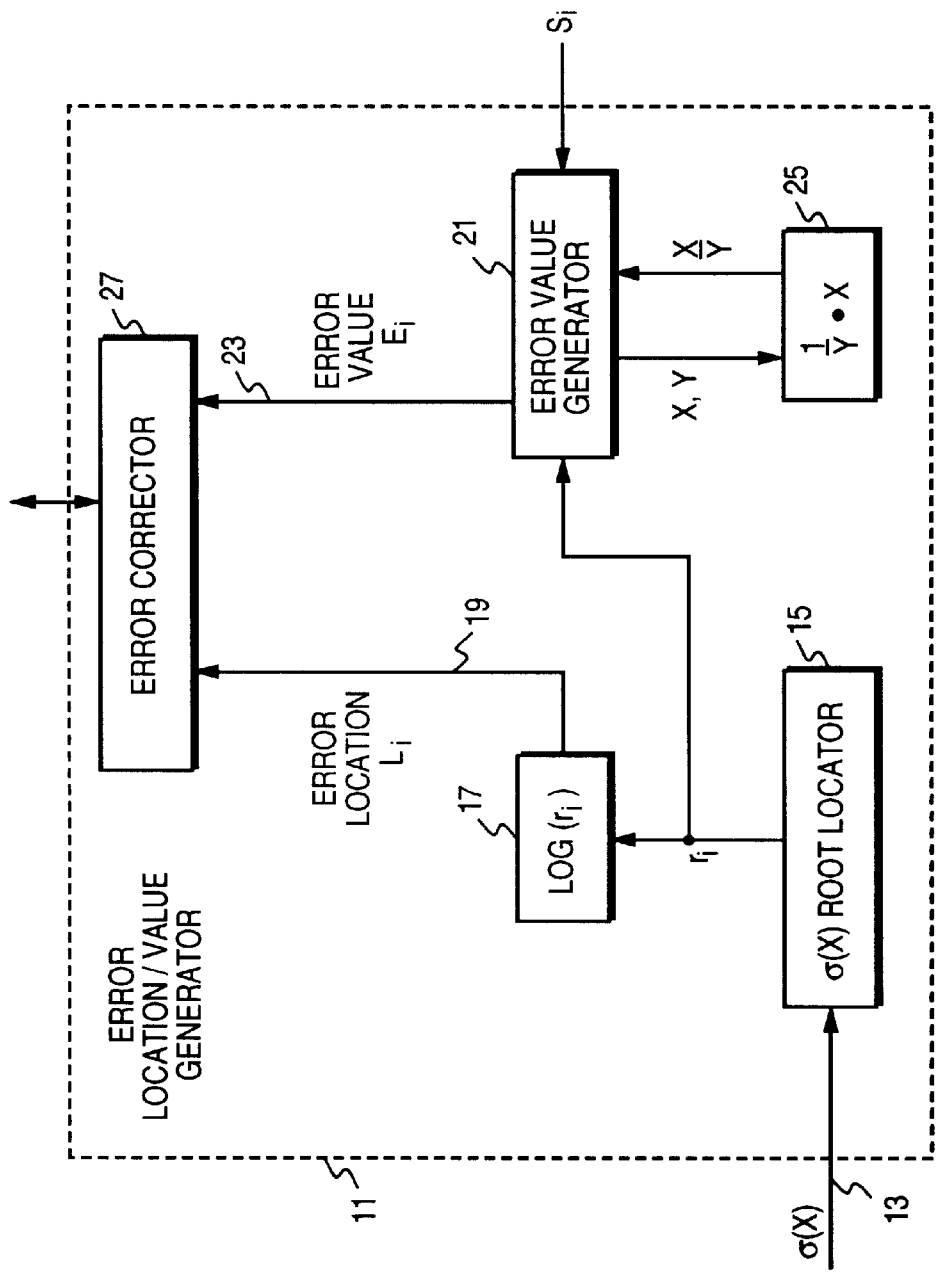
FIG. 2 shows details of an error location/value generator comprising a circuit for computing the logarithm of a field element and a circuit for computing the division of one field element by another.

Details of the error location/value generator 11 are shown in FIG. 2. The coefficients of the error locator polynomial σ(x) are received over line 13. A root locator circuit 15 processes the error locator polynomial σ(x) to determine its roots denoted $r_i$. Any of the known methods for finding the coefficients of the error locator polynomial σ(x) and its roots can be employed in the present invention (see the above reference U.S. Pat. Nos. 5,446,743 and 5,280,488 for examples). A logarithm circuit 17 computes the error locations $L_i$ 19 as $LOG(r_i)$, and the error locations $L_i$ together with the roots $r_i$ of the error locator polynomial are used by an error value generator 21 to determine the error values $E_i$ 23. Any of the known methods can be used in the present invention for determining the error values $E_i$ 23, including the methods disclosed in the above referenced U.S. Pat. Nos. 5,446,743 and 5,280,488. In computing the error values $E_i$ 23, the error value generator 21 typically must perform a division of one field element by another as described above. Thus, a division circuit 25 is provided which performs the division of x/y by computing the inverse of y and multiplying by x. Having computed the error locations $L_i$ 19 and error values $E_i$ 23, an error corrector 27 reads the appropriate codeword symbol from the data buffer 1, corrects it, and restores the corrected symbol to the data buffer 1. The corrected user data is then transferred to the host system, thereby completing the read operation.

Disclosed below are varying embodiments of a finite field processor for computing the logarithm (and inverse) of an element in a finite field. As stated above, the general objective is to avoid the cost and size of the circuitry required to implement the same operations using a lookup table (e.g., a ROM). A lookup table must be on the order of the field size such that a one-to-one mapping exists between the input vector and output vector. An enabling aspect of the present invention is that the bits of the logarithm are computed serially. In this manner, a reduced amount of combinatorial logic can be employed to generate each bit of the logarithm, for example, by computing one bit per clock cycle. Thus, for a finite field of $GF(2^8)$, the size of a lookup table to implement the logarithm operation would be on the order of 256 by 8 bits, whereas the present invention implements the same operation using one-eighth of the circuitry. Furthermore, the present invention provides the capability to compute the logarithm and inverse of an element concurrently using the same circuitry, thereby obviating the need for two lookup tables on the order of 256 by 8 bits.

The examples provided below are specific to a finite field of characteristic 2 and of order 256 (i.e., $GF(2^8)$), generated using a polynomial basis where the generator polynomial p(x) is $$p(x)=x^8+x^4+x^3+x^2+x^1.$$

Although the circuits described below implement the logarithm and inverse operations for a finite field generated using the above generator polynomial, the aspects of the present invention are more general. Those skilled in the art will appreciate that the concepts disclosed herein are applicable to finite fields generated by other generator polynomials, as well as to finite fields of other characteristics and/or to finite fields generated using a basis other than a polynomial basis.

"Bit 0" of Log Circuit

Figure 3A:
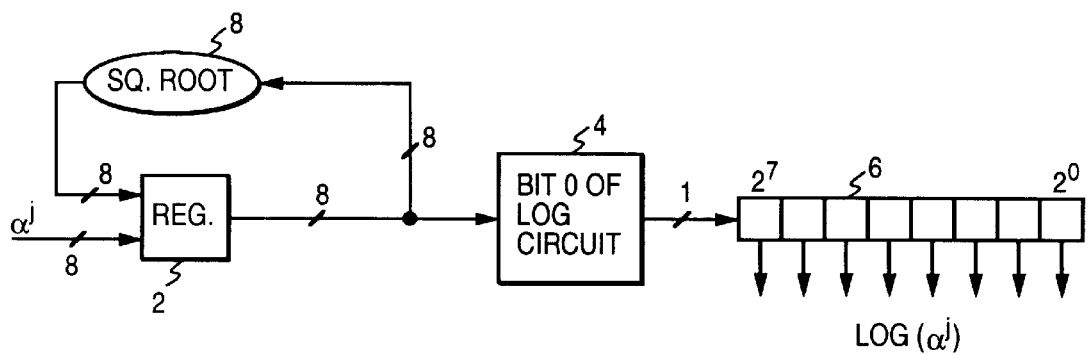
FIG. 3A shows details of one embodiment of the finite field processor of the present invention which computes the logarithm of an element in a finite field $GF(2^8)$ one bit per clock cycle (i.e., in 8+1 clock cycles) using a "bit 0" of log circuit.

One embodiment of the finite field processor of the present invention is shown in FIG. 3A. This embodiment computes the logarithm of a field element (i.e., the exponent of $\alpha^j$) serially one bit per clock cycle. On the first clock cycle, the field element is loaded into register 2. During each clock cycle thereafter, the least significant bit (bit 0) of the exponent is extracted and stored in an output register. Also during each clock cycle, the exponent is circularly shifted once to the right to facilitate extracting the next bit of the exponent during the next clock cycle. After nine clock cycles, the output register will comprise all eight bits of the exponent (i.e., $LOG_\alpha(\alpha^j)$).

In the preferred embodiment, the means for circularly shifting the exponent of a field element to the right is carried out by taking the square root of the field element. Taking the square root of a field element $\alpha^j$ actually results in a circular shift of the exponent j. This is understood by considering the square root operation separately for an even and odd exponent. For an even exponent, the square root operation simply divides the exponent by 2 (shifts it right by one), with the least significant bit (a "0" bit) circularly shifted to the most significant bit $$(\alpha^j)^{1/2}=\alpha^{j/2} \text{ for j even.}$$

For an odd exponent, the square root can be computed as follows $$(\alpha^j)^{1/2}=(\alpha^j\alpha^{255})^{1/2}=(\alpha^{j+255})^{1/2}=(\alpha^{(j-1)+256})^{1/2}=\alpha^{(j-1)/2+128} \text{ for j odd.}$$

The term (j−1)/2 in the exponent of the last equality shifts the exponent right by one, and the term 128 places a "1" bit in the most significant position of the exponent. In effect, the least significant bit (a "1" bit) is circularly shifted to the most significant bit.

The square root operation can be implemented as a linear function of the input vector. The boolean expression for the square root operation can be determined by taking the inverse of the boolean expression for the square operation. In a finite field of characteristic 2 (i.e., $GF(2^8)$), the square of an element x can be expressed as $$x^2=x_0\alpha^0+x_1\alpha^2+x_2\alpha^4+x_3\alpha^6+x_4\alpha^8+x_5\alpha^{10}+x_6\alpha^{12}+x_7\alpha^{14}.$$

The constants $\alpha^8 \ldots \alpha^{14}$ can be expressed in terms of the elements $\alpha^0$ to $\alpha^7$ in the field $GF(2^8)$ as determined by the generator polynomial. For the above generator polynomial p(x), the constants are $\alpha^8=\alpha^4+\alpha^3+\alpha^2+1$
$\alpha^{10}=\alpha^6+\alpha^5+\alpha^4+\alpha^2$
$\alpha^{12}=\alpha^7+\alpha^6+\alpha^3+\alpha^2+1$
$\alpha^{14}=\alpha^4+\alpha+1$.

Substituting these expressions into the above equation for computing $x^2$ and combining terms leads to $$x^2=(x_0+x_4+x_6+x_7)\alpha^0+$$
$$x_7\alpha^1+(x_1+x_4+x_5+x_6)\alpha^2+$$
$$(x_4+x_6)\alpha^3+(x_2+x_4+x_5+x_7)\alpha$$
$$^4+x_5\alpha^5+(x_3+x_5+x_6)\alpha^6+x_6\alpha^7.$$

The output vector $y=x^2$ is then represented as
$y_0=x_0+x_4+x_6+x_7$
$y_1=x_7$
$y_2=x_1+x_4+x_5+x_6$
$y_3=x_4+x_6$
$y_4=x_2+x_4+x_5+x_7$
$y_5=x_5$
$y_6=x_3+x_5+x_6$
$y_7=x_6$.

In matrix form $$\begin{bmatrix} 1 & 0 & 0 & 0 & 1 & 0 & 1 & 1 \\ 0 & 0 & 0 & 0 & 0 & 0 & 0 & 1 \\ 0 & 1 & 0 & 0 & 1 & 1 & 1 & 0 \\ 0 & 0 & 0 & 0 & 1 & 0 & 1 & 0 \\ 0 & 0 & 1 & 0 & 1 & 1 & 0 & 1 \\ 0 & 0 & 0 & 0 & 0 & 1 & 0 & 0 \\ 0 & 0 & 0 & 1 & 0 & 1 & 1 & 0 \\ 0 & 0 & 0 & 0 & 0 & 0 & 1 & 0 \end{bmatrix} \begin{bmatrix} X_0 \\ X_1 \\ X_2 \\ X_3 \\ X_4 \\ X_5 \\ X_6 \\ X_7 \end{bmatrix} = \begin{bmatrix} Y_0 \\ Y_1 \\ Y_2 \\ Y_3 \\ Y_4 \\ Y_5 \\ Y_6 \\ Y_7 \end{bmatrix}$$

The square root operation can now be expressed as the inverse of the above matrix $$\begin{bmatrix} 1 & 1 & 0 & 1 & 0 & 0 & 0 & 0 \\ 0 & 0 & 1 & 1 & 0 & 1 & 0 & 0 \\ 0 & 1 & 0 & 1 & 1 & 1 & 0 & 1 \\ 0 & 0 & 0 & 0 & 0 & 1 & 1 & 1 \\ 0 & 0 & 0 & 1 & 0 & 0 & 0 & 1 \\ 0 & 0 & 0 & 0 & 0 & 1 & 0 & 0 \\ 0 & 0 & 0 & 0 & 0 & 0 & 0 & 1 \\ 0 & 1 & 0 & 0 & 0 & 0 & 0 & 0 \end{bmatrix} \begin{bmatrix} Y_0 \\ Y_1 \\ Y_2 \\ Y_3 \\ Y_4 \\ Y_5 \\ Y_6 \\ Y_7 \end{bmatrix} = \begin{bmatrix} X_0 \\ X_1 \\ X_2 \\ X_3 \\ X_4 \\ X_5 \\ X_6 \\ X_7 \end{bmatrix}$$

from which the square root expression for $x=y^{1/2}$ can be generated
$x_0=y_0+y_1+y_3$
$x_1=y_2+y_3+y_5$
$x_2=y_1+y_3+y_4+y_5+y_7$
$x_3=y_5+y_6+y_7$
$x_4=y_3+y_7$
$x_5=y_5$
$x_6=y_7$
$x_7=y_1$.

The above combinatorial logic for implementing the "bit 0" of log circuit 4 and the square root operator 8 is significantly less expensive than a lookup table on the order of the field size (i.e., a 256 by 8 bit ROM).

Turning now to the circuitry disclosed in FIG. 3A, on the first clock cycle, the field element $\alpha^j$ for which the logarithm is to be computed is loaded into an intermediate register 2. On the next clock cycle, a "bit 0" of log circuit 4 generates the least significant bit of the exponent, which is shifted into the $2^7$ position of an 8-bit output register 6. During the same clock cycle, a square root operator 8 computes the square root of the field element $\alpha^j$, and the result is restored to the intermediate register 2. As described above, the effect of the square root operator 8 is to shift the exponent of $\alpha^j$ right by one, thereby shifting the next significant bit of the exponent into the bit 0 position. On the next clock cycle, the "bit 0" of log circuit 4 outputs bit 0 of the exponent of the field element stored in the intermediate register 2, the contents of the output register 6 are shifted right by one, and bit 0 of the exponent is shifted into the $2^7$ position of the shift register 6. The square root operator 8 computes the square root of the field element stored in the intermediate register 2 to again shift the exponent of $\alpha^j$ right by one, and the result is restored to the intermediate register 2. This procedure is re-iterated for a total of eight clock cycles, after which the output register 6 comprises the exponent of $\alpha^j$ (i.e., the output register 6 comprises $\text{LOG}_\alpha(\alpha^j)=j$).

The "bit 0" of log circuit 4 of FIG. 3A is implemented using combinatorial logic. The boolean expression is determined by minimizing sum-of-product terms that correspond to a "1" in bit 0 of the following $\text{LOG}_\alpha(\alpha^j)$ table

TABLE 2

| $\alpha^j$ | Bit 0 of $\text{LOG}_\alpha(\alpha^j)\downarrow$ |
|---|---|
| $\alpha^0$ | 00000000 |
| $\alpha^1$ | 00000001 |
| $\alpha^2$ | 00000010 |
| $\alpha^3$ | 00000011 |
| $\alpha^4$ | 00000100 |
| . | . |
| . | . |
| . | . |
| $\alpha^{253}$ | 11111101 |
| $\alpha^{254}$ | 11111110 |

The following table of vectors represents a minimized two level sum-of-products (minterms) for the "bit 0" of log circuit 4 corresponding to bit 0 in the above table

TABLE 3

| | | | |
|---|---|---|---|
| 0x1101x1 | 1x10x001 | x010x111 | 0xx1011x |
| 010x0111 | 1xx10010 | x10101x0 | 1x011011 |
| x0x00011 | 0011000x | x100x010 | x11x1111 |
| 1x10x111 | 00x0001x | x111001x | 0x100100 |
| 000x1111 | x1101000 | 000x1001 | 100xx011 |
| 00111x00 | 11000x0x | x1000x01 | 0x1x0011 |
| 01x01101 | 00001xx0 | 00x101x1 | 11101xx1 |
| 110011x0 | 0xx11010 | 11x0x001 | 111x00x0 |
| 10x1x011 | 011111xx | 1000110x | 10x0011x |
| 00x0100x | 100xx000 | 10x111x0 | x0100xx0 |
| xx110110 | x1011x00 | 1011110x | 101xx010 |
| 1x010001 | 11xx0101 | 0100101x | |

Figure 4:
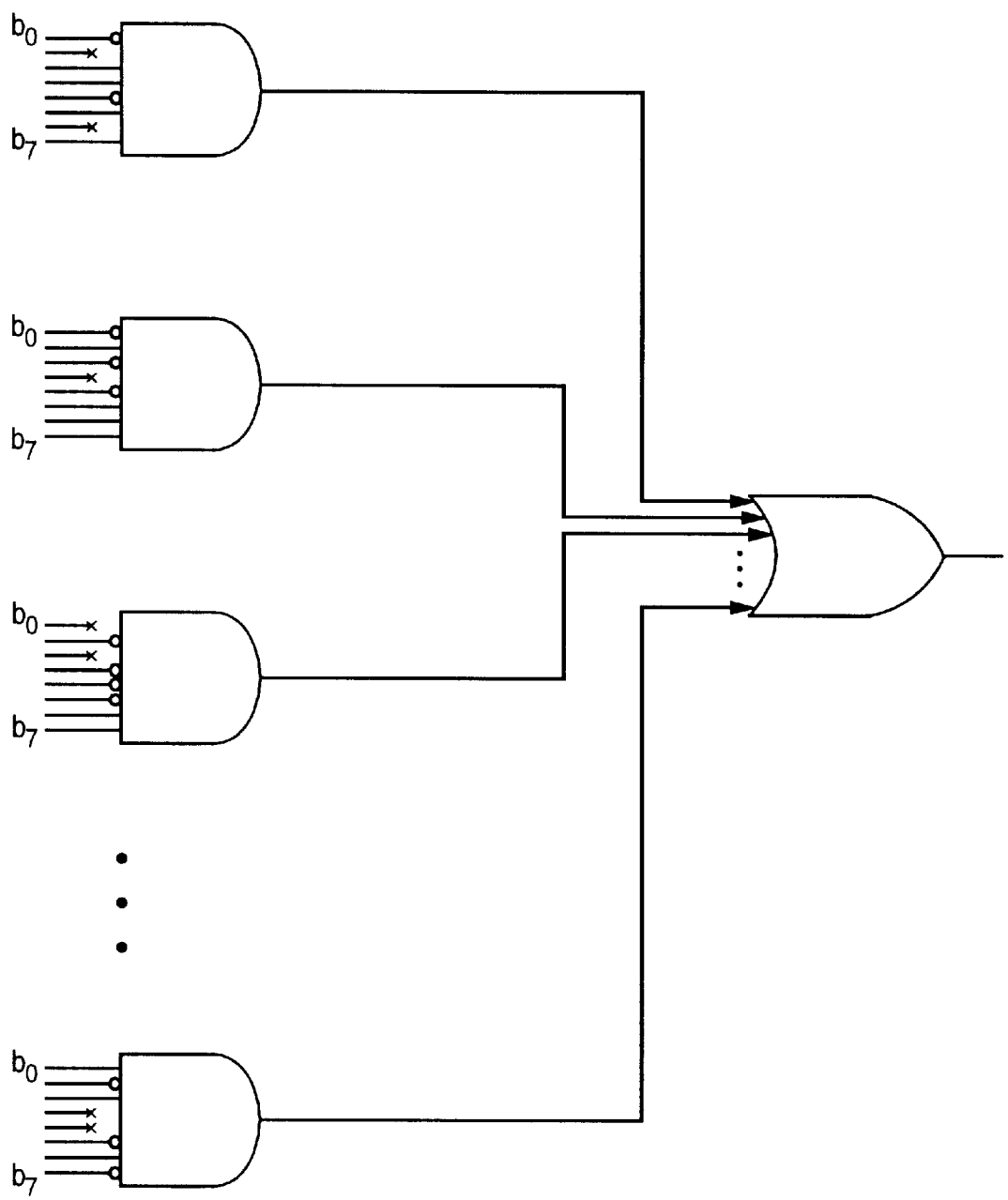
FIG. 4 discloses details concerning the "bit 0" of log circuit of FIGS. 3A–3C.

FIG. 4 shows a configuration of two level AND gates which implement the two level sum-of-products for the above table of vectors.

Figure 3B:
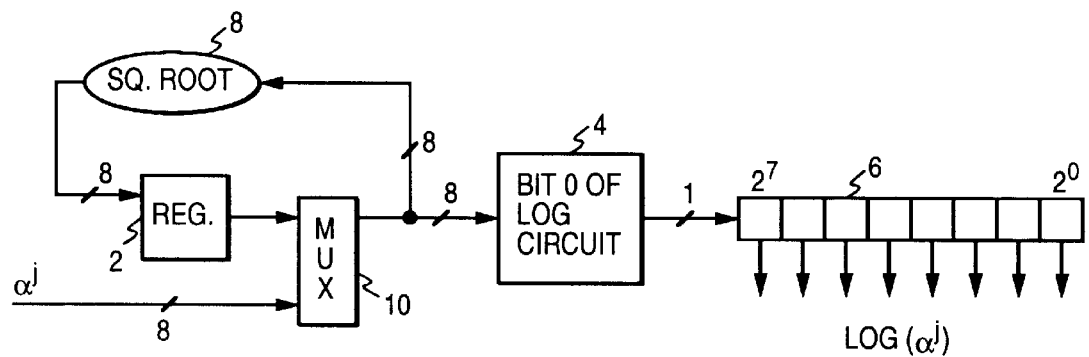
FIGS. 3B and 3C show alternative embodiments of the finite field processor of FIG. 1A which compute the logarithm of an element from a finite field $GF(2^8)$ serially in 8 clock cycles.

FIG. 3B shows an alternative embodiment for the "bit 0" of log version of the finite field processor of the present invention. This embodiment computes $\text{LOG}_\alpha(\alpha^j)$ in eight clock cycles as compared to nine clock cycles as required in FIG. 3A. Instead of clocking the field element $\alpha^j$ into the intermediate register 2 during the first clock cycle, the field element $\alpha^j$ is applied directly to the "bit 0" of log circuit 4 through a multiplexer 10 and to the feed back circuit for computing the square root of $\alpha^j$. The circuit of FIG. 3B then operates the same as in FIG. 3A as described above, but the operation $\text{LOG}_\alpha(\alpha^j)$ finishes in one less clock cycle. It should be understood that this modification is applicable to the other example embodiments described throughout this disclosure.

Figure 3C:
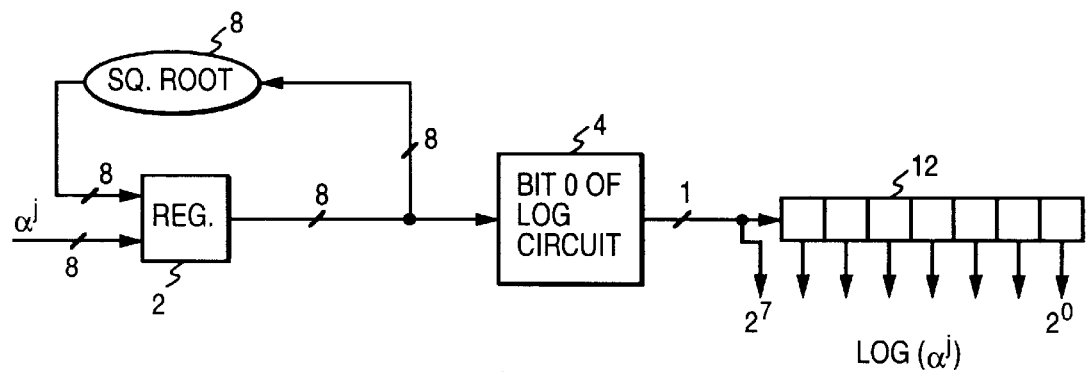

FIG. 3C illustrates yet another embodiment of the "bit 0" of log version of the present invention which also computes $\text{LOG}_\alpha(\alpha^j)$ in eight clock cycles. The modification here is that the output register 12 stores only seven bits of the result with the most significant bit (i.e., bit $2^7$) being extracted along with the bits stored in the output register 12 on the last clock cycle. It should be understood that this modification is applicable to the other example embodiments described throughout this disclosure.

Figure 5:
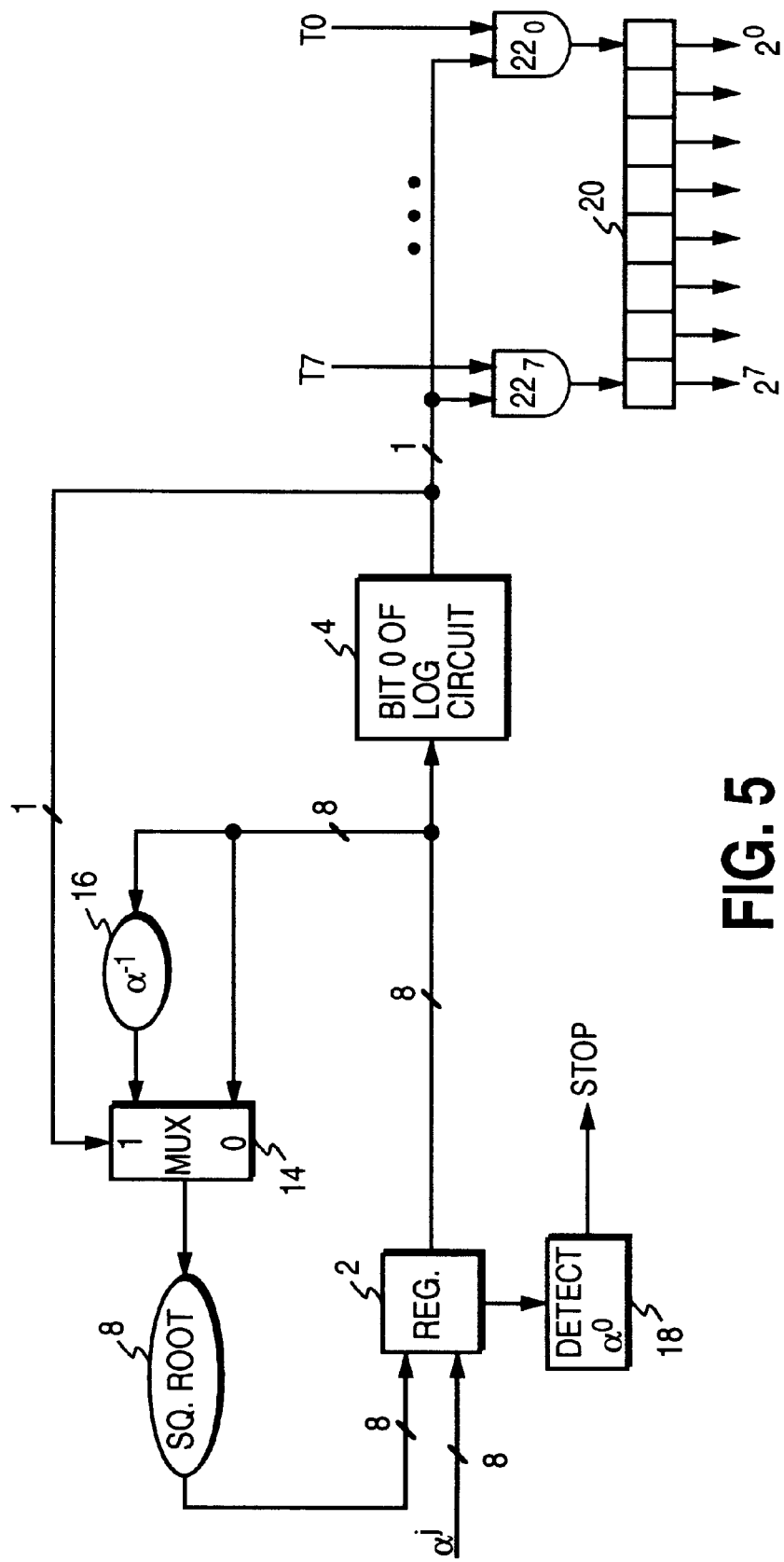
FIG. 5 is yet another alternative embodiment of the finite field processor which computes the logarithm of an element in a finite field $GF(2^8)$ similar to the circuit of FIG. 3A, but in less time (saves one-half a clock cycle on average).

FIG. 5 shows yet another alternative embodiment of the "bit 0" of log version of the present invention which computes the logarithm of a field element similar to the embodiment of FIG. 3A, but in less time (saves one-half a clock cycle on average). In this embodiment, the feedback path of the square root operator 8 is modified to include a multiplexer 14 and an $\alpha^{-1}$ multiplier 16. The effect of this modification is to change the circular shift operation of the square root circuit 8 into a logical shift right by one operation (i.e., a "0" bit is always shifted into the most significant bit position). This is carried out by multiplying the field element stored in the intermediate register 2 by $\alpha^{-1}$ 16 when the exponent of the field element is odd (i.e., when bit 0 of its exponent is a "1" bit), thereby decrementing the exponent of the field element to make it an even number. As described above, taking the square root of a field element with an even exponent results in a logical shift right by one of the exponent. When the exponent of the field element stored in the intermediate register is $\alpha^0$, the logarithm operation is complete because the remaining bits of the exponent are all "0" bits. Thus, the circuit of FIG. 5 includes a comparator 18 for determining when the field element stored in the intermediate register 2 equals $\alpha^0$. The shift register 6 of FIG. 3A is also replaced with a parallel register 20 (comprised of S/R flip flops instead of D flip flops) that is loaded a bit at a time through enabling AND gates $22_0$–$22_7$ on each clock cycle (the register 2 is loaded with the element for which the logarithm is to be computed at time T–1). The parallel register 20 is initialized with "0" bits at the beginning of each logarithm operation so that the higher order bits are "0" if the logarithm operation finishes in less than nine clock cycles.

Figure 6:
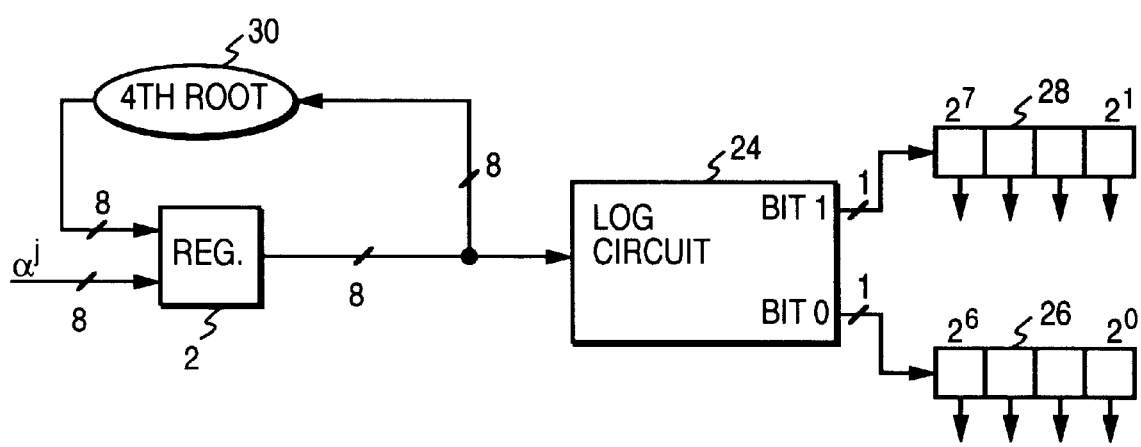
FIG. 6 discloses still another alternative embodiment of the finite field processor which computes the logarithm of an element in a finite field $GF(2^8)$ two bits per clock cycle (i.e., the logarithm is computed in five clock cycles) using a "bit 1/0" of log circuit.

FIG. 6 shows still another embodiment of the "bit 0" of log version of the present invention. In this embodiment, the "bit 0" of log circuit 4 of FIG. 3A is replaced with a "bit 1/0" of log circuit 24; that is, the exponent of the field element is generated two bits at a time (bit 1 and bit 0). The "bit 0" output generates the even numbered bits of the exponent ($2^6$, $2^4$, $2^2$, $2^0$) stored in a first shift register 26, and the "bit 1" output generates the odd numbered bits of the exponent ($2^7$, $2^5$, $2^3$, $2^1$) stored in a second shift register 28. This embodiment requires additional combinatorial logic to generate bit 1 of the exponent corresponding to bit 1 of Table 2 above; it is within the ability of those skilled in the art to generate the corresponding sum-of-products expression and circuitry similar to FIG. 4. The square root operator 8 of FIG. 3A is also replaced with a fourth root operator 30 which shifts the exponent of the field element to the right by two every clock cycle. Those skilled in the art will appreciate that the present invention could be extended to generate more than two bits of the exponent per clock cycle using additional "bit x" combinatorial logic and a higher root operator.

"Bit 0" of Log and Inverse Circuit

Figure 7:
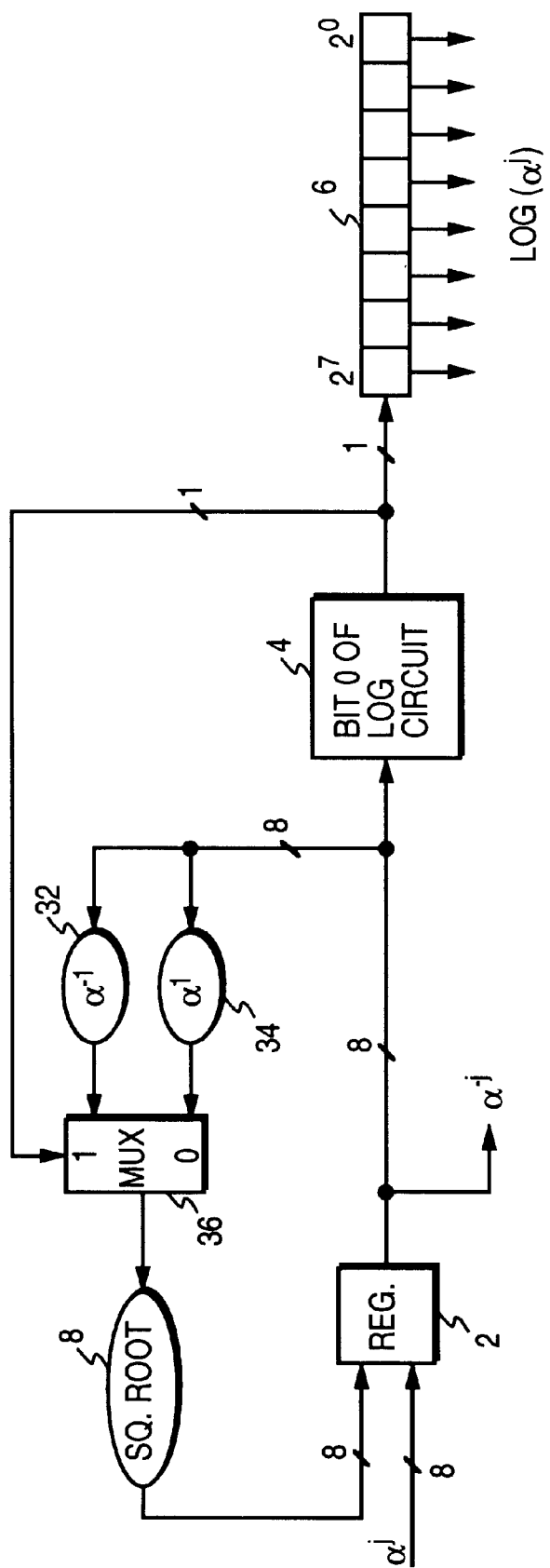
FIG. 7 shows a finite field processor of the present invention which computes the logarithm and the inverse of an element in a finite field $GF(2^8)$ concurrently using the same circuitry.

It is possible to modify the circuit shown in FIG. 3A to generate both the logarithm and inverse of a field element concurrently in nine clock cycles. This embodiment is shown in FIG. 7. The operation for generating the logarithm of the field element $\alpha^j$ is essentially the same as in FIG. 3A. That is, the exponent is shifted to the right by one on each clock cycle, and the "bit 0" of log circuit 4 extracts bit 0 of the exponent which is shifted into the output register 6.

Complementing the exponent of a field element $\alpha^j$ generates the inverse of the element $$\alpha^j = \alpha^{255-j} = \alpha^{-j}.$$

The addition of an $\alpha^{-1}$ multiplier 32 and an $\alpha^1$ multiplier 34 in the feedback path of the square root circuit 8 implements the inverse operation by taking the compliment of the exponent during the circular shift operation.

To understand how the circuit of FIG. 7 compliments the exponent of the field element $\alpha^j$, consider the cases where the field element stored in the intermediate register 2 comprises an even or odd exponent. If the exponent is even, then bit 0 of the exponent is "0" which selects, via multiplexer 36, the output of the $\alpha^1$ multiplier 34. The $\alpha^1$ multiplier 34 increments the exponent to change it into an odd number so that a "1" bit is shifted into the most significant position of the exponent. In other words, the least significant bit of the exponent, which was a "0", is complemented into a "1" and circularly shifted into the most significant bit of the exponent. Similarly, if the exponent is odd, then bit 0 of the exponent is "1" which selects, via multiplexer 36, the output of the $\alpha^{-1}$ multiplier 32. The $\alpha^{-1}$ multiplier 32 decrements the exponent to change it into an even number so that a "0" bit is shifted into the most significant position of the exponent. In other words, the least significant bit of the exponent, which was a "1", is complemented into a "0" and circularly shifted into the most significant bit of the exponent. After nine clock cycles, the exponent of the field element stored in the intermediate register 2 will be the compliment of the original exponent, therefore the field element stored in the intermediate register 2 will equal the inverse $\alpha^{-j}$ of the original field element $\alpha^j$.

Alternate "Bit 0" of Log Circuit

Figure 8:
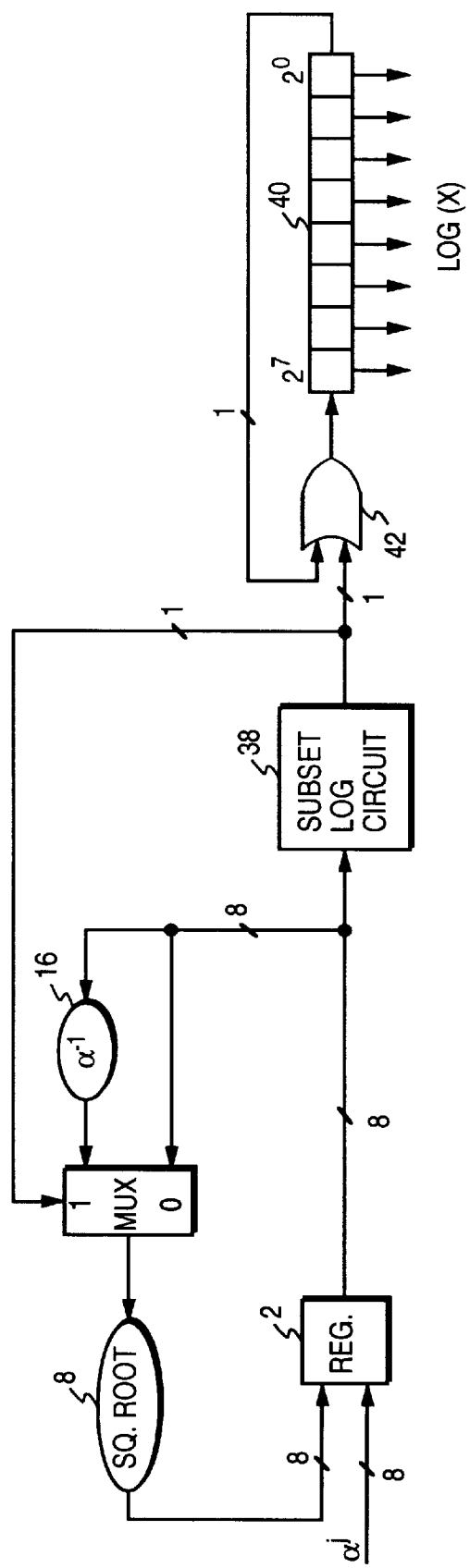
FIG. 8 shows a further cost reduced finite field processor for computing the logarithm of an element in a finite field $GF(2^8)$ in 17 clock cycles by computing the logarithm for a subset of elements, and computing the logarithm for the other elements through a rotation of the subset logarithms.

FIG. 8 shows an embodiment of the present invention which reduces the combinatorial logic used to implement the "bit 0" of log circuit 4 of FIG. 3A, but requires seventeen as opposed to nine clock cycles to complete the logarithm operation. The enabling aspect of this embodiment is the use of subset log circuit 38 which outputs a "1" bit when the exponent of the field element stored in the intermediate register 2 is in a subset of exponents in the field $GF(2^8)$. The subset of exponents and corresponding field elements are listed in the following table

TABLE 4

| element | exponent | element | exponent | element | exponent |
|---------|----------|---------|----------|---------|----------|
| 00000010 | 00000001 | 00000011 | 00011001 | 11010010 | 00111011 |
| 00001000 | 00000011 | 00001100 | 00011011 | 01101111 | 00111101 |
| 00100000 | 00000101 | 00110000 | 00011101 | 10100001 | 00111111 |
| 10000000 | 00000111 | 11000000 | 00011111 | 11010110 | 01010101 |
| 00111010 | 00001001 | 01001010 | 00100101 | 01111111 | 01010111 |
| 11101000 | 00001011 | 00110101 | 00100111 | 10100011 | 01011011 |
| 10000111 | 00001101 | 01110111 | 00101011 | 11100010 | 01011111 |
| 00100110 | 00001111 | 11000001 | 00101101 | 11001110 | 01101111 |
| 10011000 | 00010001 | 00100011 | 00101111 | 10010011 | 01110111 |
| 01011010 | 00010011 | 00001010 | 00110011 | 11001100 | 01111111 |
| 01110101 | 00010101 | 00101000 | 00110101 | | |
| 11001001 | 00010111 | 10100000 | 00110111 | | |

The subset of exponents in the above table exhibit the following characteristics which are exploited by the circuit of FIG. 8:

1. The subset exponents are all unique rotations meaning that an arbitrary circular rotation of one of the exponents will generate an exponent outside the subset (or the exponent itself).

2. A circular rotation of an exponent outside the subset will eventually result in an exponent inside the subset.

3. Logically shifting an exponent inside the subset to the right will result in another exponent inside the subset when the least significant bit is "1" after the shift.

In view of the above characteristics of the subset exponents, the circuit of FIG. 8 operates as follows. On the first clock cycle, the field element $\alpha^j$ is clocked into the intermediate register 2. Then the exponent of the field element $\alpha^j$ is circularly shifted by taking the square root 8 of the field element stored in the intermediate register 2 until the exponent is in the subset in the above table. Thereafter, the subset exponent is shifted logically to the right using an $\alpha^{-1}$ multiplier 16 and a multiplexer 14 as described above with reference to FIG. 5, and bit 0 of the subset exponent is simultaneously shifted into a shift register 40. Once the bits of the subset exponent have been shifted into the shift register 40, the shift register 40 is circularly rotated to the right using feedback and an OR gate 42 until the total number of clock cycles equals 17. At the end of 17 clock cycles, the shift register 40 will comprise the exponent of the original field element $\alpha^j$ (i.e., it will comprise $\text{LOG}_\alpha(\alpha^j)$).

The following table of vectors represents a minimized two level sum-of-products (minterms) for the subset log circuit 38 of FIG. 8 corresponding to Table 4 above

TABLE 5

| | | | |
|---|---|---|---|
| 0111x111 | 101000x1 | 010x1010 | 001x0000 |
| 00x01000 | 0x110101 | 1100x001 | 11101000 |
| 1x000000 | 011x1111 | 10010011 | 00100110 |
| x0100000 | 11010x10 | 10000111 | 11100010 |
| 0000x010 | 110011x0 | 00001x00 | |
| 00x00011 | 10011000 | 00111010 | |

The sum-of-products in the above table is preferably implemented using two level AND gates similar to the circuitry shown in FIG. 4.

Figure 9:
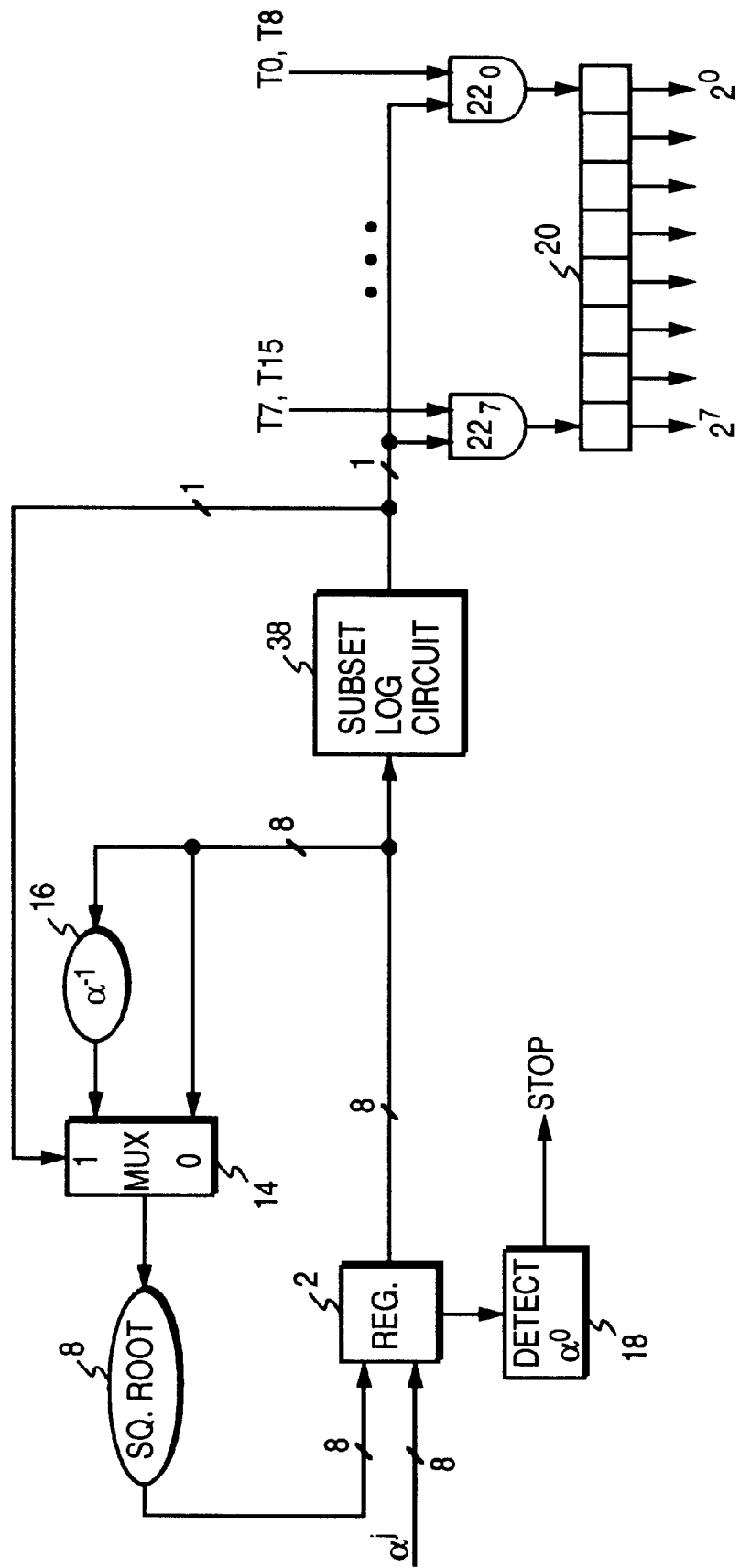
FIG. 9 shows an alternative embodiment for the finite field processor of FIG. 8 which computes the logarithm of an element in the finite field $GF(2^8)$ in at most 17 clock cycles and 11 clock cycles on average.

The circuit shown in FIG. 9 is an alternative embodiment of the subset version of the present invention which computes the logarithm similar to the circuit of FIG. 8, but in less time (saves one-half clock cycle on average). Its operation is essentially the same as the circuit shown in FIG. 5 described above, but employing the subset modification of FIG. 8 to reduce the combinatorial logic of the "bit 0" of log circuit 4.

Figure 10:
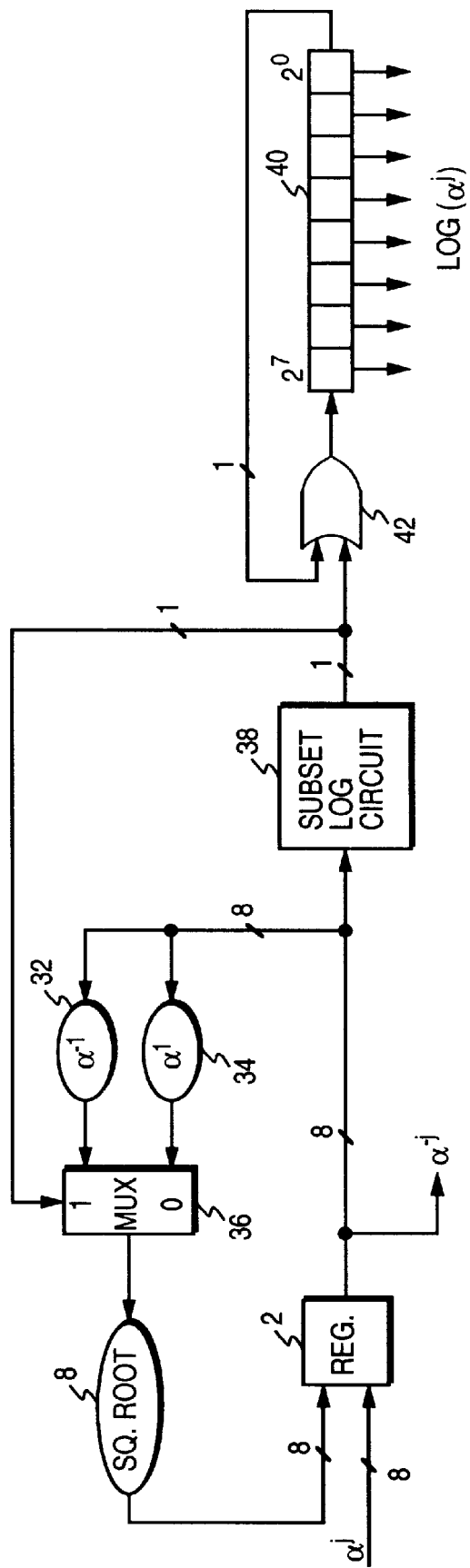
FIG. 10 shows a cost reduced finite field processor for computing both the logarithm and the inverse of an element in a finite field $GF(2^8)$ using a "subset" log circuit and rotating the subset logarithms as in FIG. 8.

The circuit shown in FIG. 10 is an alternative embodiment of the subset version of the present invention which computes both the logarithm and inverse of the field element $\alpha^j$ simultaneously using the same circuitry. Its operation is essentially the same as the circuit shown in FIG. 7 described above, but employing the modification of FIG. 8 to reduce the combinatorial logic of the "bit 0" of log circuit 4.

In the above embodiments of the present invention, circuitry for detecting and inhibiting the logarithm (and inverse) operation for the field element equal to zero (the logarithm and inverse of zero is undefined) has not been shown. Although it would be necessary to detect the field element equal to zero, those skilled in the art understand that this circuitry is trivial. For example, one could simply compare the input field element to zero before loading the field element into register 2.

The objects of the invention have been fully realized through the embodiments disclosed herein. Those skilled in the art will appreciate that the various aspects of the invention can be achieved through different embodiments without departing from the essential function. For example, the preferred embodiments of the present invention have been disclosed for a finite field of characteristic 2 (i.e., GF($2^n$)) generated using a polynomial basis. However, those skilled in the art could extend the present invention to finite fields of other characteristics and generated using other basis. Also note that an obvious alternative embodiment of the present invention is to use a "bit 7" of log circuit in place of the "bit 0" of log circuit. In such an embodiment, the square root operator would be replaced with a square operator, and the bits of the exponent would be collected in reverse order (i.e., $2^7$ to $2^0$). The enabling aspect is that the exponent of $\alpha^j$ is shifted so that a "bit x" of log circuit can extract bit x of the exponent serially. Thus, the particular embodiments disclosed are illustrative and not meant to limit the scope of the invention as appropriately construed by the following claims.

What is claimed is:

1. A finite field processor for correcting errors in digital data recorded on a disk storage medium by computing the logarithm of an element of a finite field GF(q) in a series of steps over a plurality of clock cycles, wherein the logarithm result comprises a plurality of units, the finite field processor comprising:

(a) an intermediate register for storing an intermediate value;

(b) a feedback circuit connected to receive the intermediate value from the intermediate register, the feedback circuit for modifying the intermediate value, the modified intermediate value being restored to the intermediate register;

(c) a conversion circuit for converting the intermediate value stored in the intermediate register into a unit of the logarithm; and (d) an output register for storing the units of the logarithm output by the conversion circuit as they are computed in series.

2. The finite field processor as recited in claim 1, wherein the feedback circuit computes a root of the intermediate value.

3. The finite field processor as recited in claim 2, wherein the feedback circuit computes a square root of the intermediate value.

4. The finite field processor as recited in claim 2, wherein the feedback circuit computes a fourth root of the intermediate value.

5. The finite field processor as recited in claim 1, wherein the feedback circuit computes a power of the intermediate value.

6. The finite field processor as recited in claim 5, wherein the feedback circuit computes a square of the intermediate value.

7. The finite field processor as recited in claim 1, wherein the conversion circuit is a combinatorial logic circuit.

8. The finite field processor as recited in claim 1, further comprising a multiplier circuit preceding the feedback circuit for multiplying the intermediate value by $\alpha^{-1}$.

9. The finite field processor as recited in claim 1, further comprising a multiplier circuit preceding the feedback circuit for multiplying the intermediate value by $\alpha^{-1}$.

10. The finite field processor as recited in claim 1, further comprising:

(a) a first multiplier circuit preceding the feedback circuit for multiplying the intermediate value by $\alpha^{-1}$;

(b) a second multiplier circuit preceding the feedback circuit for multiplying the intermediate value by $\alpha^1$, wherein the intermediate value stored in the intermediate register equals the inverse of the element of the finite field when the logarithm has been completely calculated.

11. The finite field processor as recited in claim 1, further comprising a comparator for comparing the intermediate value stored in the intermediate register with $\alpha^0$, wherein the logarithm is completely calculated when the comparison is equal.

12. The finite field processor as recited in claim 1, wherein the output register is a random access register comprising a plurality of random access storage cells, further comprising a means for loading the appropriate storage cell with the unit of the logarithm output by the conversion circuit.

13. The finite field processor as recited in claim 1, wherein the finite field is defined over $GF(2^n)$ where n is an integer.

14. The finite field processor as recited in claim 13, wherein the logarithm is computed in less than n clock cycles.

15. A method of correcting errors in digital data recorded on a disk storage medium by computing the logarithm of an element of a finite field GF(q) in a series of steps over a plurality of clock cycles, wherein the logarithm result comprises a plurality of units, comprising the steps of:
    (a) storing an intermediate value in an intermediate register;
    (b) modifying the intermediate value and restoring the modified intermediate value to the intermediate register;
    (c) converting the intermediate value stored in the intermediate register into a unit of the logarithm; and
    (d) storing the units of the logarithm in an output register as they are computed in series.

16. The method for correcting errors as recited in claim 15, wherein the step of modifying the intermediate value comprises the step of computing a root of the intermediate value.

17. The method for correcting errors as recited in claim 15, wherein the step of modifying the intermediate value comprises the step of computing a power of the intermediate value.

18. The method for correcting errors as recited in claim 15, further comprising the step of multiplying the intermediate value by $\alpha^{-1}$ before the step of modifying the intermediate value.

19. The method for correcting errors as recited in claim 15, further comprising the step of multiplying the intermediate value by $\alpha^1$ before the step of modifying the intermediate value.

20. The method for correcting errors as recited in claim 15, further comprising the steps of:
    (a) multiplying the intermediate value by $\alpha^{-1}$ before the step of modifying the intermediate value;
    (b) multiplying the intermediate value by $\alpha^1$ before the step of modifying the intermediate value; and
    (c) selecting one of the outputs of the two multipliers as the intermediate value to be modified,
wherein the intermediate value stored in the intermediate register equals the inverse of the element of the finite field when the logarithm has been completely calculated.

21. The method for correcting errors as recited in claim 15, further comprising the step of comparing the intermediate value stored in the intermediate register with $\alpha^0$, wherein the logarithm is completely calculated when the comparison is equal.

22. The method for correcting errors as recited in claim 15, wherein the output register is a random access register comprising a plurality of random access storage cells, further comprising the step of loading the appropriate storage cell with the unit of the logarithm.

23. The method for correcting errors as recited in claim 15, wherein the finite field is defined over $GF(2^n)$ where n is an integer.

24. The method for correcting errors as recited in claim 23, wherein the logarithm is computed in less than n clock cycles.

25. A method of correcting errors in digital data recorded on a disk storage medium by computing the logarithm of an element of a finite field GF(q) in a series of steps over a plurality of clock cycles, wherein the resulting logarithm comprises a plurality of units, comprising the steps of:
    (a) generating an intermediate value in response to the element and storing the intermediate value in an intermediate register;
    (b) generating a unit of the logarithm in response to the value stored in the intermediate register;
    (c) modifying the value stored in the intermediate register;
    (d) repeating steps (b) and (c) at least once until all of the units of the logarithm are computed.

26. The method for correcting errors as recited in claim 25, wherein the step of modifying comprises the step of computing a root of the value stored in the intermediate register.

27. The method for correcting errors as recited in claim 25, wherein the step of modifying comprises the step of computing a power of the value stored in the intermediate register.

28. The method for correcting errors as recited in claim 25, wherein the finite field is defined over $GF(2^n)$ where n is an integer.

29. The method for correcting errors as recited in claim 28, wherein the logarithm is computed in less than n clock cycles.

30. A finite field processor for correcting errors in digital data recorded on a disk storage medium by computing the logarithm of an element of a finite field GF(q) in a series of steps over a plurality of clock cycles, wherein the logarithm result comprises a plurality of units, the finite field processor comprising:
    (a) a means for shifting an exponent of the element to generate a shifted exponent;
    (b) a means for extracting a unit of the shifted exponent which represents a unit of the logarithm of the element; and
    (c) an output register for storing the units of the logarithm as they are computed in series.

31. The finite field processor as recited in claim 30, wherein the means for shifting comprises a circuit for computing a root of a field element.

32. The finite field processor as recited in claim 30, wherein the means for shifting comprises a circuit for computing a power of a field element.

33. The finite field processor as recited in claim 30, further comprising a means for inverting the exponent of the element to generate an inverse of the element.

34. An error correction processor for correcting errors in digital data recorded on a disk storage medium, comprising:
    (a) a syndrome generator for generating error syndromes during a read operation;
    (b) an error location/value generator for generating error locations and error values in response to the error syndromes during a read operation; and
    (c) a finite field processor for computing a logarithm of an element of a finite field GF(q) in a series of steps over a plurality of clock cycles, wherein the logarithm result comprises a plurality of units, the finite field processor comprising:
        (i) an intermediate register for storing an intermediate value;
        (ii) a feedback circuit connected to receive the intermediate value from the intermediate register, the feedback circuit for modifying the intermediate value, the modified intermediate value being restored to the intermediate register;

(iii) a conversion circuit for converting the intermediate value stored in the intermediate register into a unit of the logarithm; and (iv) an output register for storing the units of the logarithm output by the conversion circuit as they are computed in series.

35. The error correction processor as recited in claim 34, wherein the feedback circuit computes a root of the intermediate value.

36. The error correction processor as recited in claim 34, wherein the feedback circuit computes a power of the intermediate value.

37. The error correction processor as recited in claim 34, wherein the finite field processor further comprises a multiplier circuit preceding the feedback circuit for multiplying the intermediate value by $\alpha^{-1}$.

38. The error correction processor as recited in claim 34, wherein the finite field processor further comprises a multiplier circuit preceding the feedback circuit for multiplying the intermediate value by $\alpha^1$.

39. The error correction processor as recited in claim 34, wherein the finite field processor further comprises:

(a) a first multiplier circuit preceding the feedback circuit for multiplying the intermediate value by $\alpha^{-1}$;

(b) a second multiplier circuit preceding the feedback circuit for multiplying the intermediate value by $\alpha^1$, wherein the intermediate value stored in the intermediate register equals the inverse of the element of the finite field when the logarithm has been completely calculated.

40. The finite field processor as recited in claim 34, further comprising a comparator for comparing the intermediate value stored in the intermediate register with $\alpha^0$, wherein the logarithm is completely calculated when the comparison is equal.

\* \* \* \* \*